United States Patent [19]

Harnden, Jr. et al.

[11] Patent Number: 4,584,525

[45] Date of Patent: Apr. 22, 1986

[54] CURRENT-SHUNT SYSTEM FOR KNOWN CONDUCTORS

[75] Inventors: John D. Harnden, Jr.; Henry A. F. Rocha; Milton D. Bloomer, all of Schenectady, N.Y.

[73] Assignee: General Electric Company, Schenectady, N.Y.

[21] Appl. No.: 485,789

[22] Filed: Apr. 18, 1983

[51] Int. Cl.$^4$ .................. G01R 19/00; G01R 1/067
[52] U.S. Cl. ..................................... 324/126; 324/72.5; 324/105
[58] Field of Search .................. 324/74, 126, 127, 64, 324/65 P, 105, 72.5

[56] References Cited

U.S. PATENT DOCUMENTS

| | | | |
|---|---|---|---|
| 720,335 | 2/1903 | Eastman | 326/126 |
| 2,362,372 | 11/1944 | Halfmann | 324/127 |
| 3,037,161 | 5/1962 | Cummings | 324/72.5 X |
| 3,617,870 | 11/1971 | Howes | 324/402 |
| 4,186,339 | 1/1980 | Finger | 324/126 |
| 4,295,475 | 10/1981 | Torzala | 340/600 X |

FOREIGN PATENT DOCUMENTS 2652314 11/1976 Fed. Rep. of Germany ...... 324/105

OTHER PUBLICATIONS

Carr, J., "Digital Interfacing with an Analog World", First ed., 1978, pp. 79-81.
Amman, S., "Noise-Proofing a Digital Voltmeter with Off-the-Shelf Microelectronics", Electronics, Nov. 16, 1964, pp. 92-96.

Primary Examiner—Stewart J. Levy
Assistant Examiner—Stephen M. Baker
Attorney, Agent, or Firm—Geoffrey H. Krauss; James C. Davis, Jr.; Marvin Snyder

[57] ABSTRACT

A system for measuring currents flowing through a conductor uses the current-carrying conductor itself as the measurement shunt. The voltage developed across the inherent resistance of a fixed length of current-carrying conductor is measured and scaled to provide a displayable voltage of magnitude equal to the magnitude of current flowing in the conductor. Compensation for conductor temperature rise can be utilized, as can a multimeter accommodating various conductor materials and/or sizes.

14 Claims, 3 Drawing Figures

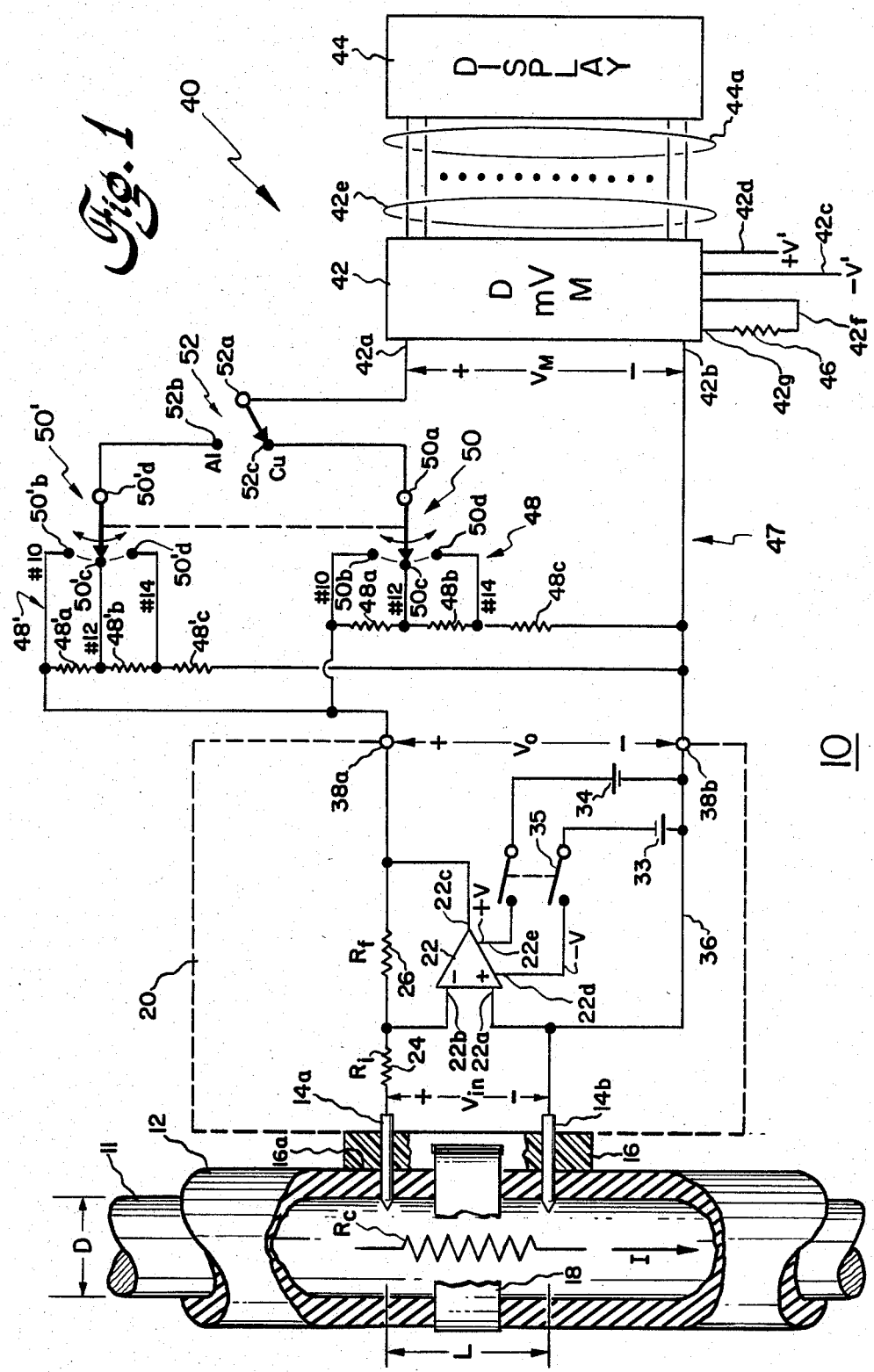

CURRENT-SHUNT SYSTEM FOR KNOWN CONDUCTORS

BACKGROUND OF THE INVENTION

The present invention relates to current measurement apparatus and, more particularly, to a novel system for measuring current flowing through a conductor of known size and material, without the use of current transformers or external current shunts.

It is well known to measure the current flowing in a conductor, without requiring the breaking of that conductor for insertion of metering apparatus, by utilizing a current transformer or a current shunt external to the current-carrying conductor. Both prior-art approaches are relatively expensive. Apparatus of relatively low cost and simplicity is desirable for enabling service personnel and home owners to measure current in wiring, without requiring that the wires be cut and metering apparatus inserted therein.

BRIEF SUMMARY OF THE INVENTION

In accordance with the invention, the resistance of a known length of a conductor is utilized to provide a voltage, proportional to the current flowing in that conductor, between a pair of voltage-sensing contacts. The voltage between the contacts is amplified by a low-drift operational amplifier with self-contained power supply, and provides an output voltage of magnitude related to the magnitude of the instantaneous current flowing through the conductor.

In presently preferred embodiments, the operational amplifier feedback resistance may be switchably selectable to establish a scale factor related to the wire material and/or size, to compensate for the change of conductor resistance therewith. A temperature compensation network may be utilized in the operational amplifier feedback circuit, or in the feedback circuit of a second, subsequent operational amplifier, for compensation of the conductor temperature coefficient, when the feedback circuit temperature-sensitive components are placed in proximity with the conductor itself. The operational amplifier output may be scaled by switch-selectable wire size/material scaling means to provide an output voltage having an instantaneous magnitude substantially equal to the instantaneous magnitude of the current flowing in the conductor, which scaled voltage magnitude can be provided to metering circuitry for display, to the user, of the value of AC and/or DC current flowing through the conductor being probed.

Accordingly, it is an object of the present invention to provide novel apparatus for measuring the current flowing through a conductor of known characteristics.

This and other objects of the present invention will become apparent upon consideration of the following detailed description, when read in conjunction with the drawings.

BRIEF DESCRIPTION OF THE DRAWINGS

FIG. 1 is a schematic block diagram of one presently preferred embodiment of the current-shunt system, as utilized with a multimeter, and illustrating principles of operation thereof;

DETAILED DESCRIPTION OF THE INVENTION

Figure 1A:
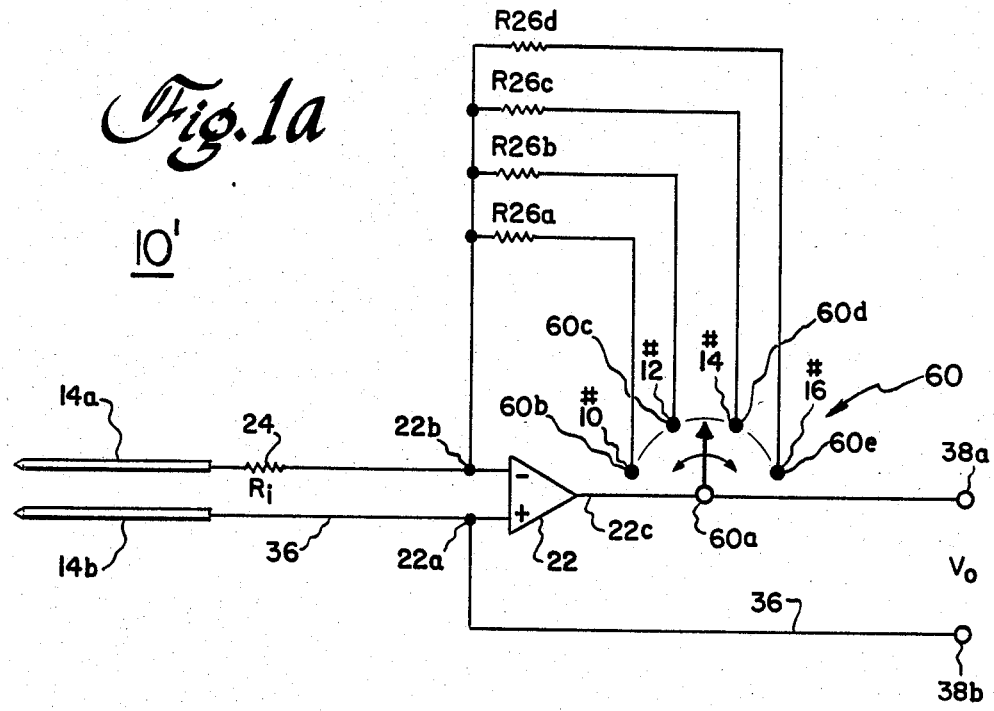
FIG. 1a is a schematic diagram of an alternate presently preferred embodiment for the input amplifier of the system.

Referring initially to FIG. 1, a system 10 for measuring the magnitude of a current I flowing in a conductor 11, is illustrated. Conductor 11 is of a known wire size, having a known diameter D, and formed of a known material, e.g. copper, aluminum and the like. Conductor 11 is typically enclosed within a tubular sheath 12 of insulative material.

A length L of conductor 11 has a resistance $R_c$ dependent upon the wire diameter D and wire material. The invention utilizes a pair of voltage-sensing contacts 14a and 14b spaced and maintained at the chosen distance L, e.g. 1 inch, from each other by fixation of a portion of the contact length in a member 16 of insulative material. Contacts 14a and 14b are positioned to contact conductor 11, such that a system input voltage $V_{in}$ is developed by the flow of current I across the conductor resistance $R_c$ between contacts 14a and 14b. Thus, the lengths of both contacts 14a and 14b, extending forward of member surface 16a, may be such that, when the pointed contacts 14 pierce insulative sheath 12, the contact tips will be in firm contact with the surface of conductor 11, when surface 16a is seated upon the exterior surface of insulative sheath 12. Means 18, such as an insulative strap and the like, may be provided at member 16 for fastening around the exterior surface of sheath 12, to maintain member 16 against the sheath and thus maintain contacts 14 in high-conductivity contact with the surface of conductor 11.

Therefore, in accordance with the invention, a pair of contacts 14 contact the current-carrying conductor 11 over a known axial length L thereof, whereby a voltage $V_{in}$, of instantaneous magnitude proportional to the instantaneous magnitude I of current flowing in the conductor, is provided across resistance $R_c$. The input voltage is buffered and provided as an output voltage $V_O$ of instantaneous magnitude proportional to the instantaneous magnitude of the current I to be measured. Buffer 20 is advantageously housed within an insulative compartment 20a, which may be an extension of insulative member 16. Buffer 20 includes a low-drift, low-noise operational amplifier 22, having a non-inverting + input 22a connected to contact 14b, an inverting − input 22b connected to contact 14a through an input resistance 24 of magnitude $R_i$, and an output 22c connected through a feedback resistance 26, of magnitude $R_f$, to input 22b. Operational amplifier 22 requires a negative operating potential −V at a negative potential input 22d and a positive operating potential +V at a positive potential input 22e, supplied thereto respectively by a negative potential source 33 and a positive potential source 34, through a double-pole, single-throw switching means 35. The operational amplifier operating potentials are referenced to the potential at input 22a, whereby sources 33 and 34 can be a pair of series-connected batteries having the common junction therebetween connected to a common bus 36, itself connected between second sensing contact 14b and the common terminal 38b of the buffer output. A buffered output terminal 38a is itself connected to the operational amplifier output 22c. Advantageously, operational amplifier 22 is of a type, such as the Intersil ICL7601 and the like, drawing relatively low current at voltages usually supplied by batteries 33 and 34.

The buffered output voltage $V_O$ is of equal value to $(-R_f/R_i)V_{in}$, while $V_{in}=IR_c$ and $R_c=kL\rho_m/D$, where $\rho_m$ is the resistivity of the material from which conductor 11 is formed and k is a proportionality constant. Therefore, the buffered output voltage is $$V_O = -(R_f \rho_m L k / R_i D) I = KI.$$

The ratio of $R_f$ to $R_i$, the only quantities in K not fixed by the conductor, can be chosen such that $K = -1$ for a particular conductor, at a given temperature. Illustratively, for a #14 AWG copper wire at 30° C. and with contacts 14 spaced L=1 inch apart, the input voltage $V_{in}$ is about 0.22 millivolts per ampere, and the full scale input voltage for the rated 15 amp. capacity (assuming T or TW types of insulation 12) is 3.3 milli-volts. By selection of the buffer amplifier gain, e.g. the ratio of $R_f$ to $R_i$, the buffered output voltage $V_O$ can be scaled to have a magnitude easily correlated to the magnitude of current I flowing in the conductor. Thus, if $(R_f/R_i) = 454.\overline{54}$, the buffered output voltage will have a magnitude of 0.1 volts per ampere and a 1.5 volt signal will appear (between terminals 38a and 38b) at the maximum 15 amp. rated capacity current of the #14 conductor.

The magnitude of the buffered voltage at terminals 38 can be made available to the user by means of a metering portion 40. Metering portion 40 includes a digital milli-volt meter means 42 having: first and second inputs 42a and 42b receiving a voltage $V_M$ to be measured; terminals 42c and 42d for receiving positive and negative DMVM means operating potentials $-V'$ and $+V'$, respectively; and a digital data meter means output port 42e. A multi-digit display means 44 has an input port 44a receiving the digital data from the meter means output port 42e for display thereof to a user. The meter means 42 may also include a means, such as resistance 46, connected between other terminals 42f and 42g, for example, for setting the meter means reference voltage. Thus, a digital voltmeter is formed by meter means 42, which may be a digital voltmeter integrated circuit such as the Intersil ICL7106 and the like, and an associated display means 44, which digital voltmeter input voltge $V_M$ may be the buffered output voltage $V_O$. Advantageously, the meter means 42 operating potentials $-V'$ and $+V'$ will be the same potentials as the buffer amplifier potentials $-V$ and $+V$, whereby terminals 42c and 42d can be respectively connected directly to respective amplifier terminals 22d and 22e. It should be understood that the digital meter means 42 can be configured to provide the required digital data output for the display for a DC input voltage and/or an AC input voltage, with either peak, or half-cycle average or RMS values for an AC voltage being selectable, whereby pertinent information about the magnitude and/or polarity of the current I flowing in conductor 11 is obtained.

It will be seen that the connection of buffered output terminals 38a and 38b, respectively, to respective metering portion input terminals 42a and 42b, respectively, will provide a current display which is accurate for only a single size (diameter D) of conductor 11 and, even then, is accurate only for one specified conductor material, e.g. copper, at a reference temperature. The utility of system 10 is greatly increased by means of a conductor size-material selection portion 47, illustrated as being placed between buffered output terminals 38 and meter portion input terminals 42. Selection portion 47 includes a number M of potential-divider means 48, e.g. a pair of resistive divider means 48 and 48' for M=2; M is equal to the number of different wire materials to be accommodated, e.g. copper and aluminum. Each divider means is comprised of a number N of series-connected impedances, e.g. divider 48 or 48' is, for N=3, comprised of three series-connected resistances 48a–48c or 48'a–48'c, for a meter system to be used with three different diameter conductors of two different conductor materials. A switch means is provided with M sections of N selectable contact terminals each. Thus, each of M=2 sections 50 or 50' of a switch means has a number N=3 of contactable terminals 50b–50d or 50'b–50'd plus a common terminal 50a or 50'a, with the number N of contactable terminals being equal to the number of different conductor sizes and the number M of switch sections being equal to the number of conductor materials with which the system can be used. A second switching means 52 is a single-pole, multiple-throw type, having its number of throws equal to the number M of materials to be accommodated. In the illustrated embodiment, wherein copper and aluminum conductors are to be accommodated, switching means 52 is a single-pole, double-throw type, having its common terminal 52a connected to the positive meter portion input 42a. A first contactable terminal 52b is connected to the common terminal 50'a of one size-selection section 50' of the switch means, while the remaining contactable terminal 52c of switch means 52 is connected to the common terminal 50a of the other size-selection section 50 of the switch means. The size-selection switching means contactable terminals for the largest-diameter conductor, e.g. #10 AWG, is connected to the high buffered signal terminal 38a, with the contactable terminals for progressively smaller diameter, i.e. greater-numbered AWG wire size, conductors being connected at points further down the voltage divider, to compensate for the greater input voltage $V_{in}$ provided by the increasing inherent conductor resistance $R_c$ of the conductor as the wire gage number increases and wire diameter decreases. Thus, by use of portion 47, between the buffer amplifier 20 and the meter/display portion 40, a single multimeter with a single pair of contacts 14 spaced a fixed distance apart, can be utilized to read the current flowing in a variety of different-sized conductors, and even conductors of different materials. It should be understood that portions 40 and 47 can be packaged separately or together, and may have suitable insulative housing and interconnections such that hazardous voltages cannot be contacted by a user.

Figure 1B:
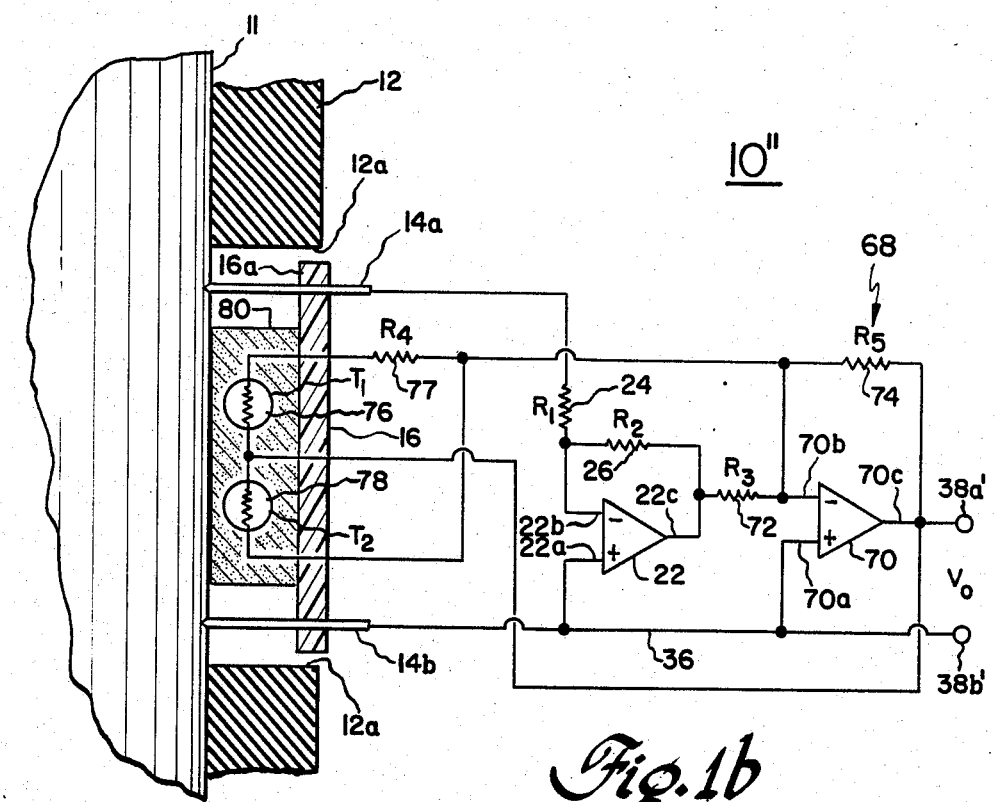
FIG. 1b is a schematic diagram of another presently preferred system amplifier embodiment, illustrating compensation for conductor temperature changes.

Referring now to FIG. 1a, if the current flowing in conductors formed of only a single material, e.g. copper, is to be measured, the wire-size selection means can be incorporated into the buffer amplifier directly. In this embodiment 10', the operational amplifier inverting input 22b is still connected to first contact 14a through input resistor 24, of magnitude R1, e.g. 1K ohm, while non-inverting input 22a is connected to the other contact 14b and to the common buffer output terminal 38b. The operational amplifier output 22c is still connected to output terminal 38a, but is connected to the common terminal 60a of a multiple-throw, single-pole switching means 60. The plurality of selectable terminals 60b–60e of switch means 60 are each connected to a first terminal of one of a like plurality of wire-size gain-setting resistances 26a–26d, each having its remaining terminal connected in parallel to amplifier input 22b.

The gain of buffer 20 is therefore set by selecting the appropriate value of feedback resistor 26 for the size of the (copper) conductor in which current is to be measured. For example, the resistance of a #14 AWG copper conductor of 1 inch length L, at 25° C., is 215 micro-ohms. At a current I of 1 amp., the voltage drop across this conductor is 215 micro-volts, which is input voltage $V_{in}$. If the desired calibration factor of the buffered output voltage $V_O$ is 10 milli-volts per amp., then the required gain of buffer 20 is about 46.6 and the feedback resistance 26c (#14 copper wire) is 46.6K ohm. By similar calculation, the feedback resistance values of 93.2K ohm, 65.9K ohm and 33.0K ohm, for respective feedback resistors 26a, 26b and 26d, can be arrived at for respective wire sizes #10, #12 and #16, respectively. In this manner, a single setting of switch means 60 adjusts the conductor current-sensing system to provide an output voltage having a single proportionality constant, e.g. 10 milli-volts per ampere, for all measurements on any conductor within the conductor size range.

The foregoing assumes that the temperature of conductor 11 remains substantially constant at a reference temperature. Generally, the flow of current I through conductor 11 causes power to be dissipated by each incremental conductor resistance $R_c$, which tends to raise the conductor temperature. For example, the resistance $R_T$ of a copper conductor at some temperature T (over the range of 0° C. to +100° C.) is given by $R_T = R_0(1 + 4.2713 \times 10^{-3}T - 8.66542 \times 10^{-8}T^2)$ where $R_0$ is the conductor resistance at 0° C. It will therefore be seen that the conductor resistance $R_c$, being a function of temperature, and therefore of both of the current flowing through the conductor and the ambient temperature, must be temperature compensated for, if the highest degree of accuracy is to be obtained. The temperature-compensation scheme of system 10" in FIG. 1b may be utilized. In embodiment 10", the low-noise operational amplifier 22 buffer, with input resistor 24 (of magnitude $R_1$) and feedback resistor 26 (of magnitude $R_2$) is connected between probe contacts 14a and 14b, but the buffer amplifier output 22c is not directly connected to the buffered voltage output terminal 38a'. A temperature-compensating buffer stage 68 is provided between the high-stability buffer 22 and output terminal 38a'. Temperature-compensating buffer 68 utilizes an operational amplifier 70, having a non-inverting + input 70a connected to common bus 36 (itself extending between contact 14b, first operational amplifier non-inverting input 22a and common output terminal 38b'). An inverting-input 70b of the second operational amplifier is connected through an input resistance 72, of magnitude $R_3$, to the first operational amplifier output 22c. A fixed feedback resistance element 74, of magnitude $R_5$, is connected between inverting input 70b and the output 70c of second operational amplifier, which output is also connected to output terminal 38a'. Also connected between output 70c and input 70b is a first thermistor 76 in series with a fixed resistance element 77, of resistance value $R_4$, and a second thermistor element 78, in parallel with the series-connected first thermistor 76 and resistance element 77. The compensating thermistors 76 and 78 must sense the temperature of that portion of the conductor between contact probes 14a and 14b; accordingly, at least thermistors 76 and 78 are mounted in a thermally-conductive, but electrically-insulative, member 80 extending forward of insulative member surface 16a. Use of the temperature-compensated meter 10" requires that a small section of the insulative sheath 12, surrounding conductor 11, be removed to form an aperture 12a through which at least member 80 and its enclosed thermistors can extend to the conductor surface. The values of fixed resistors 74 and 77 and thermistors 76 and 78 of the temperature compensation network can be determined by the method described and claimed in U.S. Pat. No. 4,300,392, assigned to the assignee of the present invention and incorporated herein in its entirety by reference. Utilizing those procedures, for a copper conductor, with a first thermistor 76 having a resistance of 3450 ohms at 25° C. (Western Thermistor Type 1C3451C4), and a second thermistor 78 having a 25° C. resistance of 91900 ohms (Western Thermistor Type 8C9192C4), the resistance $R_4$ of element 77 is calculated to be 2268 ohms and the resistance value $R_5$ of resistance element 74 is calculated to be 1075 ohms. The temperature-compensated output voltage $V_O$ will have an accuracy within ±0.5% over the range of conductor temperature from 0° C. to +100° C. for each current setting, as long as the thermistors are in close thermal contact with conductor 11. The foregoing is established for the resistance value $R_3$ of element 72 being 1 kilo-ohm, such that the nominal gain of stage 68 is set at −1 for a conductor temperature of 0° C. It should be understood that the temperature-compensation network may be utilized in the feedback path of the high-stability buffer first operational amplifier 22, although placement therein tends to generate a relatively complex total network when conductor-size switching is also to be utilized. However, for a current-measuring system to be utilized with a conductor of only a single size and material, the higher-accuracy temperature-compensated single buffer amplifier may be advantageously used. It should be similarly understood that, because different conductor materials, e.g. aluminum and the like, will require a different temperature-compensation feedback network of values, a multiple conductor-material metering system should utilize switched compensation networks, which may be provided in the selector portion 47 (of the embodiment 10 in FIG. 1).

It will now be obvious to those skilled in the art to provide many modifications and variations of our novel current-shunt system for measuring the current flowing through a conductor of known size and material. Accordingly, we intend to be limited only by the scope of the appending claims and not by the specific details and instrumentalities presented by way of description of those presently preferred embodiments included herein.

What we claim is:

1. Apparatus for measuring the magnitude of at least one of a DC current and an AC current flowing through a single conductor having a known one of a plurality of known, but different, characteristics, said single conductor being located within an insulative sheath, comprising:

means, comprising a pair of conductive contacts, for directly contacting the single conductor through said insulative sheath, at two points along the axial length thereof;

means for maintaining the contacting means at a fixed separation therebetween, to define a single conductor resistance providing, at said contacting means, a single voltage of magnitude directly proportional to the magnitude of current flowing through said single conductor;

amplifier means directly connected to said contacting means for actively buffering the voltage provided at said contacting means; and means receiving only the buffered output voltage of said buffering means for providing a user-viewable display of the magnitude of the voltage;

said buffering means being the only portion of said apparatus connected to said contacting means, and multiplying the voltage at said contacting means by a scale factor selected to cause said display means to display a value numerically equal to the magnitude of current then flowing through said conductor, and including: an operational amplifier having a non-inverting input connected to a first one of said contacts, an inverting input and an output; and a first resistance element of known magnitude having a first terminal connected to the inverting input and a second terminal connected to the remaining contact; and means for setting the scale factor to one of a like plurality of values, each selected to properly scale the voltage developed responsive to the known characteristics of the associated conductor, and including: a plurality of feedback resistance elements equal in number to the number of the plurality of different conductor characteristics to be accommodated, each feedback resistance element having a first terminal connected in parallel to one of said operational amplifier output and inverting input, and a second terminal; and switching means for connecting to the remaining one of said operational amplifier output and inverting input, the second terminal of that feedback resistance associated with the characteristics of the conductor being utilized.

2. The apparatus of claim 1, wherein said buffering means includes a low-drift operational amplifier.

3. The apparatus of claim 1, wherein said display means includes a digital voltmeter.

4. The apparatus of claim 1, further comprising means for compensating the voltage provided to said display means for changes induced therein responsive to the temperature of said conductor.

5. The apparatus of claim 4, wherein said temperature-compensating means comprises: an inverting amplifier having an input receiving the output of said buffering means, and an output; and a feedback network positioned to sense the temperature of said conductor and connected to said inverting amplifier to temperature-compensate the voltage output thereof responsive to conductor temperature changes.

6. Apparatus for measuring the magnitude of a current, having at least one of a DC component and an AC component, flowing through a single conductor of known characteristics and enclosed within an insulative sheath, comprising:

means for directly contacting only the single conductor through said insulative sheath at two points along the axial length thereof;

means for maintaining the contacting means at a fixed separation therebetween, to define a single conductor resistance providing, at said contacting means, a single voltage of magnitude directly proportional to the magnitude of current flowing only through the single conductor;

means directly connected, as the only directly connected circuitry, to said contacting means for actively buffering the single voltage provided at said contacting means;

means receiving the buffered output voltage of said buffering means for providing a user-viewable display of the magnitude of the voltage; and means for compensating the voltage provided to said display means for changes induced therein responsive to the temperature of said conductor, and comprising: an inverting amplifier having an input receiving the output of said buffering means, and an output; and a feedback network positioned to sense the temperature of said conductor and connected to said inverting amplifier to temperature-compensate the voltage output therefrom responsive to conductor temperature changes.

7. The apparatus of claim 6, wherein said buffering means includes a low-drift operational amplifier.

8. The apparatus of claim 6, wherein said display means includes a digital voltmeter.

9. The apparatus of claim 6, wherein said buffering means multiplies the voltage at said contacting means by a scale factor selected to cause said display means to display a value numerically equal to the magnitude of current then flowing through said conductor.

10. The apparatus of claim 9, wherein said apparatus is adapted for measuring the magnitude of current flowing through a conductor having a known one of a plurality of known but different characteristics; said buffering means further comprising means for setting the scale factor to one of a like plurality of values, each selected to properly scale the voltage developed responsive to the known characteristics of the associated conductor.

11. The apparatus of claim 10, wherein said contacting means comprises a pair of conductive contacts; said buffering means comprises: an operational amplifier having a non-inverting input connected to a first one of said contacts, an inverting input and an output; and a first resistance element of known magnitude having a first terminal connected to the inverting input and a second terminal connected to the remaining contact; and said setting means comprises: a plurality of feedback resistance elements equal in number to the number of the plurality of different conductor characteristics to be accommodated, each feedback resistance element having a first terminal connected in parallel to one of said operational amplifier output and inverting input, and a second terminal; and switching means for connecting to the remaining one of said operational amplifier output and inverting input the second terminal of that feedback resistance associated with the characteristics of the conductor being utilized.

12. The apparatus of claim 6, wherein said apparatus is adapted for measuring the magnitude of current flowing through a conductor having a known one of known but different resistance characteristics, said buffering means multiplying the voltage at said contacting means by a fixed value, and further comprising means for scaling the output voltage of said buffering means responsive to a selection of that known one of said plurality of conductor characteristics.

13. The apparatus of claim 12, wherein said scaling means comprises a potential divider having an input receiving the buffering means output voltage and having a number of taps equal to the number of the plurality of conductor resistance characteristics; and selector means for selecting the potential at that one of said divider taps corresponding to the resistance characteristic of the conductor in which the current is to be measured, for providing the voltage to said display means.

14. The apparatus of claim 13, also adapted for measuring the magnitude of current flowing through conductors of different materials, and further comprising: additional scale-factor setting means having tap points related to the different scale factors for the resistance characteristics of each conductor of a different material; and selector means for selecting the output from that one of the totality of setting means associated with the potential divider for the particular material of the conductor in which current is actually being measured, for providing the voltage to said display means.

* * * * *